United States Patent
Asano et al.

(10) Patent No.: US 6,850,456 B2
(45) Date of Patent: Feb. 1, 2005

(54) SUBARRAY CONTROL AND SUBARRAY CELL ACCESS IN A MEMORY MODULE

(75) Inventors: Toru Asano, Omihachiman (JP); Sang Hoo Dhong, Austin, TX (US); Takaaki Nakazato, Austin, TX (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/606,585

(22) Filed: Jun. 26, 2003

(65) Prior Publication Data

US 2004/0264280 A1 Dec. 30, 2004

(51) Int. Cl.$^7$ ............................................... G11C 8/00
(52) U.S. Cl. ................... 365/230.06; 365/205
(58) Field of Search ................ 365/230.06, 205, 365/233, 189.01

(56) References Cited

U.S. PATENT DOCUMENTS

| | | | | |
|---|---|---|---|---|
| 5,406,526 A | * | 4/1995 | Sugibayashi et al. | .. 365/230.03 |
| 5,615,168 A | * | 3/1997 | Lattimore et al. | .......... 365/233 |
| 6,115,310 A | * | 9/2000 | Netis et al. | .................. 365/210 |
| 6,512,718 B2 | * | 1/2003 | Lee | ........................ 365/230.06 |

* cited by examiner

*Primary Examiner*—Anh Phung
(74) *Attorney, Agent, or Firm*—Carr LLP; Robert M. Carwell

(57) ABSTRACT

The present invention provides a subarray control apparatus and method. The subarray control includes a wordline driver configured to generate a wordline activation signal, and a write/read control signal generator configured to generate a write/read enable signal. In addition, the subarray control includes a timing generator configured to generate a wordline timing signal input to the wordline driver and a write/read timing signal input to the write/read control signal generator. The wordline activation signal is based on enable data captured by a first transparent latching circuit and the wordline timing signal generated within the subarray. The write/read enable signal is based on enable data captured by a second transparent latching circuit and the write/read timing signal generated within the subarray. Accessing subarray cells in a memory module and a memory module incorporating the subarray control are also disclosed.

13 Claims, 3 Drawing Sheets

SUBARRAY CONTROL AND SUBARRAY CELL ACCESS IN A MEMORY MODULE

TECHNICAL FIELD

This invention relates generally to memory modules, and, more particularly, to subarray control having a transparent latch to capture enable data from outside subarray, and a timing generator configured to generate internal timing signals.

BACKGROUND OF THE INVENTION

While in operation, processors within computers continually access memory modules to store and retrieve data. Such memory modules include L1 and L2 caches, as well as Static Random Access Memory (SRAM) modules. To accomplish a memory access, an address to a specific wordline is first provided. Next, the address is decoded through a predecode and a final decode stage in order to determine the specific wordline to be activated. Once the selected wordline is activated, data from outside of a subarray of cells within the memory module is then written into the cells during a Write operation. Data written into the cells of the subarray comes out onto a bitline associated with the cells during a Read operation. Also during the Read operation, the bitline signal is detected by a sensing circuit having sense amplifiers, and the amplified signal is then captured by a read-out latch.

In high frequency memory, the total process is divided into many cycles. Since accessing small subarrays of cells is usually much faster than accessing a single large array, a large array is divided into many subarrays and cycle-bounded at the input, output, or both, of the subarrays for use in high speed memory modules. The bounding in these memory modules is typically provided by write data latches and read data latches.

In high speed memory modules, such as high frequency deep pipeline SRAMs, one memory access is accomplished in multiple pipeline cycles over short periods of time. For example, for decoding a wordline address, the predecode stage is one of these cycles and the final decode stage is another. Similarly, wordline activation to create data with the cells, as well as sense amplifier enabling to read data from bitlines, are further cycles in the pipeline process. Since many small subarrays are typically employed in place of a single large array, wordline and bitline loading is likewise smaller due to the decreased number of cells being accessed in each subarray. The reduction in wordline and bitline loading, in turn, results in wordline activation, bitline signal development and sensing, and capturing of the data. As a result, the final output signal generated fluctuates from high to low very quickly. Although cell access in multiple small subarrays improves overall memory access speed, overall timing management in large memory modules is typically difficult to govern.

Conventional timing circuitry employs control signals used by the subarray control circuitry received from outside the subarray. More specifically, an outside timing signal is typically used to govern the subarray control circuitry. Typically, enable information and launch timing comes into the subarray in the merged form. Unfortunately, the use of a control signal with timing from outside the subarray to control the circuitry is difficult to manage. More specifically, the timing of a subarray close to the source of the control signal is usually different from a distal subarray. In this conventional scheme, timing inside of both the near and far subarrays is interdependent, however, each needs to meet their own timing requirements.

Furthermore, the outside timing signal typically used in conventional designs must travel long distances before arriving at the subarray control circuit, leading to inaccuracies in the timing signal. Especially in high frequency deep pipeline memory, such inaccuracies are unacceptable. To combat this problem, buffers are often employed on the outside signal to maintain proper timing and to keep the waveform clean. However, the delay caused by the buffers to clean the timing signal can often prove detrimental to the timing involved in memory access cycles, especially in short cycle, high speed memory access, such as in high frequency deep pipeline SRAMs. Accordingly, a need exists for a subarray control circuit for use within high speed memory modules that does not suffer from the deficiencies found in conventional systems.

SUMMARY OF THE INVENTION

The present invention provides a subarray control apparatus and method. The subarray control includes a wordline driver configured to generate a wordline activation signal, and a write/read control signal generator configured to generate a write/read enable signal. In addition, the subarray control includes a timing generator configured to generate a wordline timing signal input to the wordline driver and a write/read timing signal input to the write/read control signal generator. The wordline activation signal is based on the wordline timing signal and the write/read enable signal is based on the write/read timing signal. Accessing subarray cells in a memory module and a memory module incorporating the subarray control are also disclosed.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, some details have been omitted inasmuch as such details are not considered necessary to obtain a complete understanding of the present invention, and are considered to be within the understanding of persons of ordinary skill in the relevant art.

Figure 1:
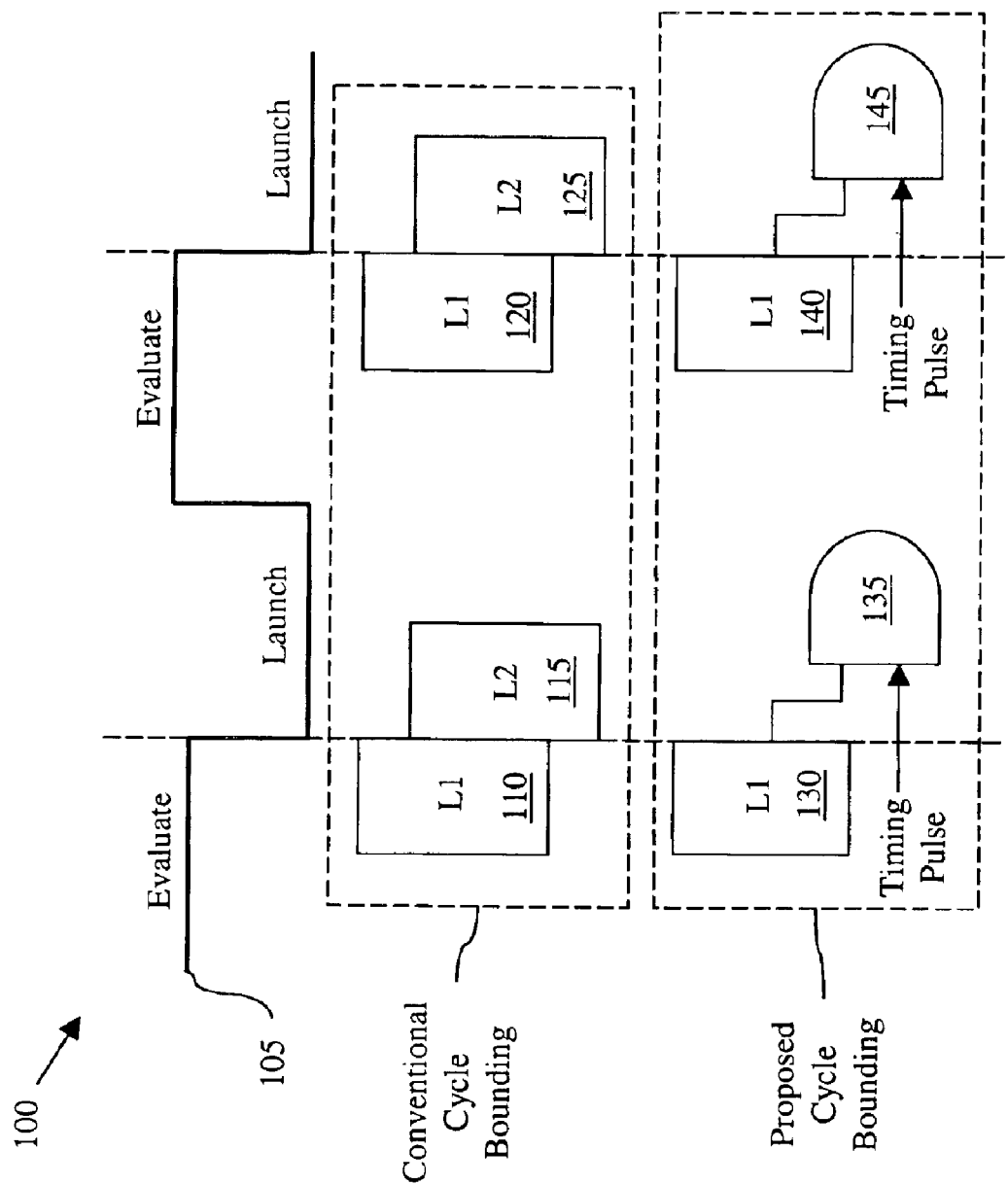
FIG. 1 illustrates a timing diagram illustrating a comparison of a conventional cycle bounding technique and one embodiment of the proposed cycle bounding technique provided by a control circuit.

Referring to FIG. 1, illustrated is a timing diagram 100 illustrating a comparison of a conventional cycle bounding technique and one embodiment of a proposed cycle bounding technique provided by a subarray control circuit. More specifically, FIG. 1 includes a timing waveform 105 illustrating the timing of multiple stages of an access of a deep pipeline memory module. Although only two stages are shown, in practice many more stages are typically present in a memory module access.

In general, latch operation is comprised of two major functions. The first is evaluating incoming data, and launching the information to the next cycle is the second function. Data or information needs to be held by the latch until the next evaluate period. In conventional latch schemes, when a signal is launched, it is determined by the inverse of the evaluation timing. However, in the proposed scheme, when a signal is launched, it is determined by a timing signal. The launching is not done by a slave latch, but by combination logic that is faster and simpler. The proposed scheme is also convenient for power management since an output is only activated when a timing pulse is generated.

During an evaluate period illustrated by the timing waveform 105, the address of a wordline (WL) for use in a subarray of cells is provided by a decoder. The decoded address is used to determine which WL will be activated. Then, during a launch period, the selected WL goes to the activate state and the associated cells are activated or deactivated to input write data into the cells, or to output cell data to a bitline (BL). During a Read operation, the data from the cells is placed on appropriate BLs and transferred to a sense amplifier (SA). When the data comes to the SA, the SA is enabled to sense high or low and amplify the data coming out on the BLs.

In the conventional cycle bounding technique, during the evaluate period a first master latch 110 is used to latch the decoded WL information and determine which WLs are to be activated. During the launch period, a first slave latch 115 is employed to activate the selected WL in order to activate specific cells in the subarray. In addition, such a combination of a master and slave latch is employed in the same manner as for WL activation to enable SAs to read the binary data coming out of the subarray of cells.

As illustrated in FIG. 1, the evaluation and launch process is repeated, although only two stages are shown. In the second stage, a second master latch 120 is employed during the second evaluate period to latch the next group of decoded WL information and determine which WL will be activated. During the launch period in the second stage, a second slave latch 125 is employed to activate the selected WL in order to activate specific cells in the subarray. Also, the second slave latch 125 is employed to enable the SAs to read the second set of binary data coming out of the subarray of cells.

As may be seen from FIG. 1, the use of a master and slave latch pair relies on the use of a single clock signal received from outside of the subarray. As a result, the respective slave latches 115, 125 employed during the launch periods are directly dependent on the master latches 110, 120 employed during the evaluate periods. As discussed above, the interdependence of the master and slave latches on a single outside clock signal prevents the independent control of circuit components in the subarray control circuit during the evaluate and launch periods, even when the timing provided by the single outside signal proves to be inaccurate or undesirable. Moreover, even if the timing provided by the outside signal is desirable, delays introduced into the outside signal, which are typically required to keep the timing of the signal and to clean the waveform, may still detrimentally affect the overall timing of the memory access cycles.

Cycle bounding is no longer accomplished by use of a master and slave latch pair for the evaluation and launch periods. In place of the interdependent master and slave latches is the use of a single latch for the evaluate periods and a logic circuit for the launch periods. More specifically, a first latch 130 employs an internally generated single clock signal. The clock is used to capture enable data from outside of the subarray. The clock is the timing contract for the enable data from outside. The enable data includes WL activation, subarray select, column select, and like information. During the first launch period, once the enable data is captured by the latch 130, an enable signal is launched through a first logic circuit 135, which may be a NAND gate, as illustrated. The launch of the enable signal is accomplished using the timing determined by the timing signal generated internally. Although the logic circuit 135 is illustrated as simply a NAND gate, it should be understood that other logic gates, such as a NOR gate, and other logic circuitry may be employed without deviating from the scope of the present invention. Alternatively, the first latch 130 may also be employed to determine which SA will be enabled to sense data from the subarray cells, and the first logic circuit 135 employed to enable the selected SA to sense output data.

Also input to the logic circuit 135 is a timing pulse separate from the clock signal input to the latch 130. By employing a timing pulse, the data received by the latch 130 is also simply an enabling data signal captured by the clock signal, and, in contrast to the conventional technique, is not directly connected to WL activation and SA enabling (SAE). As discussed in greater detail with reference to FIG. 2, the timing pulse is generated within the control circuit of each subarray, rather than depending on an external timing signal for the WL activation, SAE, etc. As a result, in one aspect, the subarray control circuit provides cycle bounding control for use in generating WL driver signals (to activate and deactivate subarray cells), SAE signals (to cause an SA to sense data from BLs), as well as other types of signal generating, using an internal timing generator to provide distinct timing signals to each WL driver and SAE generator. Locally managed timing signals give more accuracy than employing the control signals from outside of the subarray.

Figure 2:
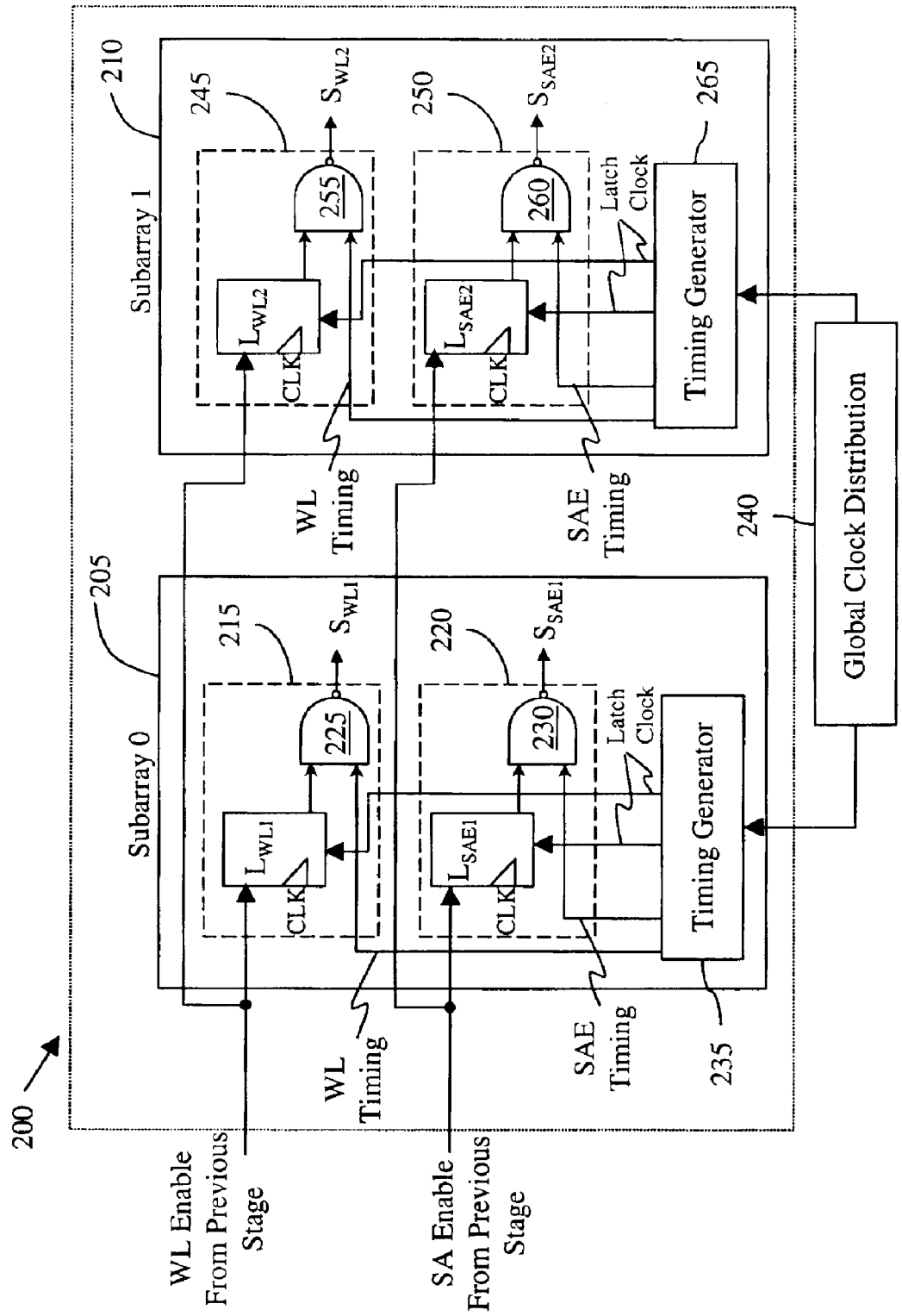
FIG. 2 illustrates a portion of a memory module having subarray control circuits.

Looking now at FIG. 2, illustrated is a portion of a memory module 200 having subarray control. More specifically, the memory module 200 includes first and second subarrays of cells 205, 210, each having a subarray control circuit associated therewith.

Although only two subarrays are shown, those who are skilled in the art will understand that any number of subarrays and associated control circuits may be employed.

The first control circuit includes a first WL driver 215 configured to generate a first WL activation signal $S_{WL1}$, and a write/read control signal generator embodied in a first SAE generator 220 configured to generate a first SAE signal $S_{SAE1}$. Although only one WL driver is illustrated, any number of WL drivers may be employed based on the number of wordlines in the subarray. Likewise, although only one SAE generator is illustrated, any number of SAE generators may be employed based on bitline configuration. Of course, other types of write/read control signal generators may also be employed in place of, or in addition to, the illustrated SAE generator. In such embodiments, a process similar to the one described herein may be used for other control signals, such as write enable, pre-charge, bit switch selection, etc.

The first WL driver 215 includes a first WL latch $L_{WL1}$, and a first logic circuit 225.

Similarly, the first SAE generator 220 includes a first SAE latch $L_{SAE1}$, and a second logic circuit 230. In the illustrated embodiment, the logic circuits 225, 230 are shown as NAND gates; however, other logic circuitry may also be employed. Because of their similar structure, the first WL driver 215 and the first SAE generator 220 function in the same manner; however, their functions occur based on different timing. Also included in the first control circuit is a first timing generator 235, coupled to both the first WL driver 215 and the first SAE generator 220. In one embodiment, the first timing generator 235 is an inverter capable of delaying timing signals output therefrom; however, other suitable components may be utilized instead or in addition. Further illustrated in FIG. 2 is a global clock distribution circuit 240, which may be a pulse generator or phase-locked loop (PLL) circuit configured to distribute a global clock signal from outside the memory module 200 to the timing generator 235. Of course, any suitable method or circuitry may be used instead of the preferred global clock distribution circuit 240.

As shown in FIG. 2, the second subarray 210 includes its own subarray control circuit having a similar structure to the control circuit of the first subarray 205. More specifically, the second control circuit includes a second WL driver 245 configured to generate a second WL activation signal $S_{WL2}$, and a second SAE generator 250 configured to generate a second SAE signal $S_{SAE2}$. The second WL driver 245 includes a second WL latch $L_{WL2}$ and a third logic circuit 255. Similarly, the second SAE generator 250 includes a second SAE latch $L_{SAE2}$ and a fourth logic circuit 260. As before, the second WL driver 245 and the second SAE generator 250 function in a similar manner, although based on different timing. Also included in the second control circuit is a second timing generator 265, coupled to both the second WL driver 245 and the second SAE generator 250. Furthermore, the global clock distribution circuit 240 also distributes a global clock signal from outside the memory module 200 to the second timing generator 265, as well as the first timing generator 235. The function of the control circuits in the memory module 200 will be described below.

A WL enable signal from a previous stage, such as the decode stage, is input to, and captured by, the first WL latch $L_{WL1}$ to reference the timing of the first WL latch $L_{WL1}$ to the previous stage. Similarly, an SAE signal from the previous stage is input to, and captured by, the first SAE latch $L_{SAE1}$, for reference. In addition, a master clock signal CLK is input to both the first WL latch $L_{WL1}$ and the first SAE latch $L_{SAE1}$, to provide a uniform timing basis for each latch $L_{WL1}$, $L_{SAE1}$. In addition, a latch clock signal is provided to both latches $L_{WL1}$, $L_{SAE1}$ from the first timing generator 235 to independently establish the latch time for each of the latches $L_{WL1}$, $L_{SAE1}$. As mentioned briefly above, the latch clocks may simply be delayed timing signals based on the global clock signal received by the first timing generator 235; however, any suitable type of timing signal generator capable of generating independent timing signals for latch operation may be employed.

Also generated by the first timing generator 235 are a WL timing signal and an SAE timing signal. As illustrated, the WL timing signal is input to the first logic circuit 225 in the WL driver 215, while the SAE timing signal is input to the second logic circuit 230 in the SAE generator 220. As with the latch clock signals, the WL and SAE timing signals are generated by the first timing generator 235 based on the global clock signal, and are distinct and independent timing signals. As the subarray control circuit operates, the WL timing signal determines when the WL driver 215 generates the first WL activation signal $S_{WL1}$ in order to activate or deactivate the cells in the first subarray 205. Likewise, the SAE timing signal determines when the SAE generator 220 generates the first SAE signal $S_{SAE1}$ in order to enable an SA to read the data created by the subarray cells. However, by employing the WL timing signal to determine when the WL driver 215 will generate the first WL activation signal $S_{WL1}$, the activation of the selected WL is not directly dependent on the timing of the first WL latch $L_{WL1}$, as it typically is when using conventional techniques. Likewise, employing the SAE timing signal to determine when the SAE generator 220 generates the first SAE signal $S_{SAE1}$ also allows the first SAE signal $S_{SAE1}$ to be independent of the timing of the first SAE latch $L_{SAE1}$.

The second subarray control circuit operates in the same manner. Specifically, the WL enable signal from the previous stage is also input to, and captured by, the second WL latch $L_{WL2}$ to reference the timing of the second WL latch $L_{WL2}$ to the previous stage. Similarly, the SAE signal from the previous stage is input to, and captured by, the second SAE latch $L_{SAE2}$ for reference. Also, the master clock signal CLK is input to both latches $L_{WL2}$, $L_{SAE2}$ to provide a uniform timing basis for each. The second timing generator 265 receives the global clock signal and provides a latch clock signal to both latches $L_{WL2}$, $L_{SAE2}$ based on the global clock signal to independently establish the latch time for each of the latches $L_{WL2}$, $L_{SAE2}$.

Like the first timing generator 235, the second timing generator 265 also generates WL timing and SAE timing signals. The WL timing signal is input to the third logic circuit 255 in the second WL driver 245, while the SAE timing signal is input to the fourth logic circuit 260 in the second SAE generator 250. As before, the WL and SAE timing signals are generated by the second timing generator 265 based on the global clock signal, and are distinct and independent timing signals. As the second subarray control circuit operates, the WL timing signal determines when the second WL driver 245 generates the second WL activation signal $S_{WL2}$ in order to activate or deactivate the cells in the second subarray 210. Likewise, the SAE timing signal determines when the second SAE generator 250 generates the second SAE signal $S_{SAE2}$ in order to enable an SA to read the data created by the subarray cells. However, as in the first control circuit, the second WL activation signal $S_{WL2}$ and the second SAE signal $S_{SAE2}$ are not directly dependent on the timing of the second WL latch $L_{WL2}$ and the second SAE latch $L_{SAE2}$ respectively.

Thus, by removing the interdependency on the timing of the WL latches $L_{WL1}$, $L_{WL2}$ and SAE latches $L_{SAE1}$, $L_{SAE2}$, subarray control as disclosed herein provides independent control of both the WL activation signals $S_{WL1}$, $S_{WL2}$ and the SAE signals $S_{SAE1}$, $S_{SAE2}$ allowing for easier timing design in complex power control applications. As a result, regardless of when the WL latches $L_{WL1}$, $L_{WL2}$ and SAE latches $L_{SAE1}$ $L_{SAE2}$ complete their respective operations during each evaluate period, generation of the WL activation signals $S_{WL1}$, $S_{WL2}$ and the SAE signals $S_{SAE1}$, $S_{SAE2}$ occur at any desired timing when tiling generators 235, 265 are employed in each control circuit. Providing such independent timing control of WL drivers 215, 245 and SAE generators 220, 250 provides the capability to overcome inaccurate or undesirable timing typically present in a single outside timing signal. Additionally, delays introduced into the outside signal in order to keep the timing of the signal and to clean the waveform may be avoided with timing generators employed within the subarray control circuits, in accordance with the principles disclosed herein.

Figure 3:
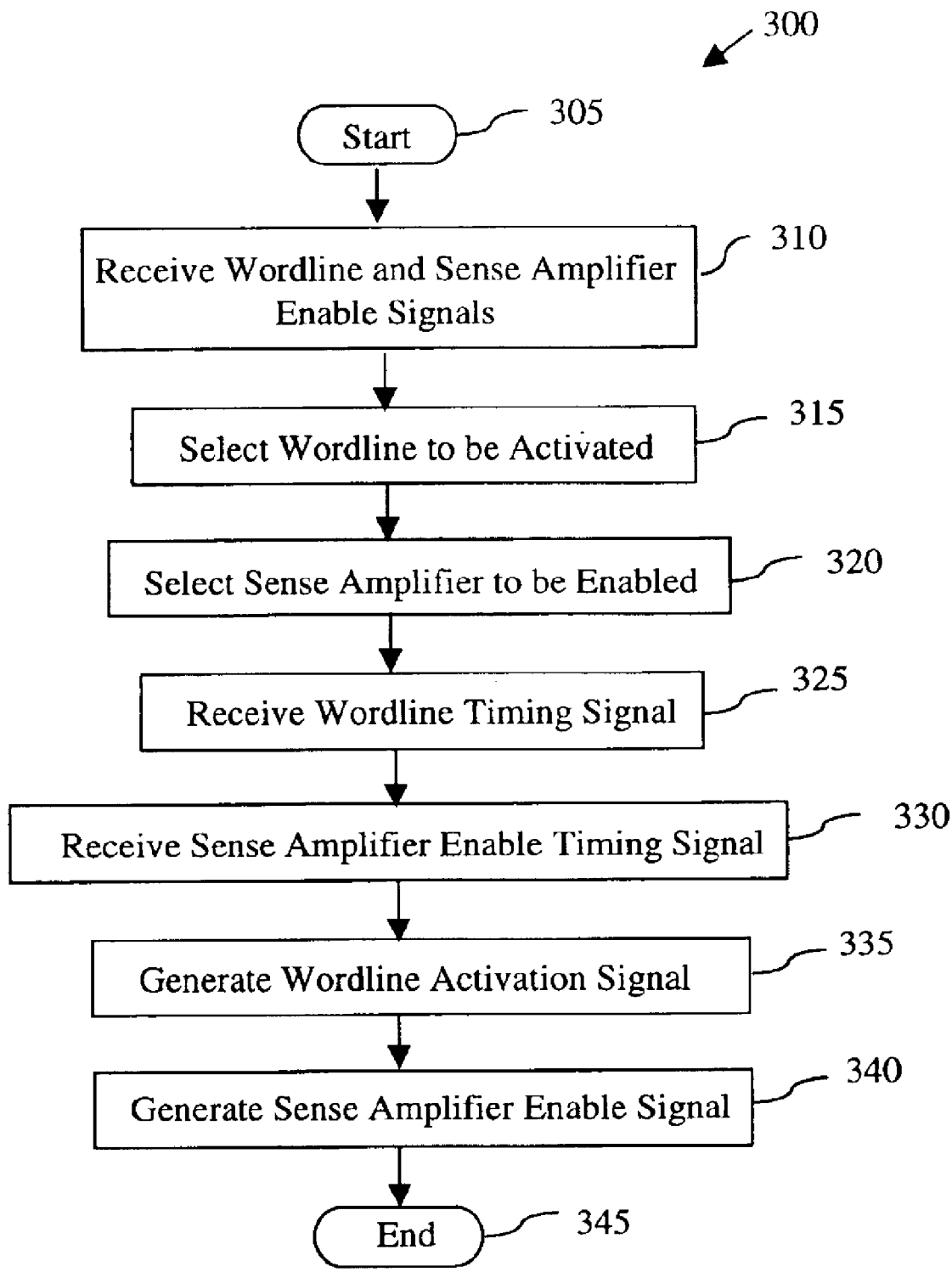
FIG. 3 illustrates a flow diagram of one embodiment of a method of accessing subarray cells in a memory module.

Turning finally to FIG. 3, illustrated is a flow diagram 300 of one embodiment of a method of accessing subarray cells in a memory module. It should be understood that the flow diagram 300 illustrated in FIG. 3 includes simplified steps in order to better understand the proposed subarray control, and is not intended to be limited to any particular number of steps. The method begins at a start step 305.

At a step 310, a WL enable signal from a previous stage is received by a WL latch. In addition, during the step 310, an SAE signal from a previous stage is received by an SAE latch. At a step 315, the WL to be activated is selected. This selection is made by the WL latch based on the WL enable signal received in step 310 and a master clock signal input to the WL latch, as well as a latch clock used to establish the timing of the latch. Next, the sense amplifier that will be enabled is selected, at a step 320. The selection of the sense amplifier is made by the SAE latch based on the SAE signal received in step 315 and a master clock signal input to the SAE latch, as well as a latch clock used to establish the timing of the latch.

Then, at a step 325, a WL timing signal is transmitted to a logic circuit coupled to the WL latch. Similarly, at a step 330, an SAE timing signal is transmitted to a different logic circuit coupled to the SAE latch. Both the WL timing signal and the SAE timing signal are generated by a timing generator based on a global clock signal received by the timing generator. Next, at a step 335, a WL activation signal is generated from the logic circuit coupled to the WL latch based on a combination of an output of the WL latch and the WL timing signal. As mentioned above, the WL activation signal may then be employed to activate a specific WL associated with a subarray of cells in the memory module. Next, at a step 340, an SAE signal is generated from the logic circuit coupled to the SAE latch based on a combination of an output of the SAE latch and the SAE timing signal. Also as discussed, the SAE signal may then be employed to sense data created by the subarray of cells and placed on bitlines associated with the cells in order to generate a final data output signal from the memory module. The process then ends at an end step 345.

Those who are skilled in the art will understand that the subarray control as disclosed herein is not limited to the specific steps set forth in FIG. 3. Thus, a greater or lesser number of steps may be employed. Additionally, steps having greater or lesser detail than those illustrated in FIG. 3 may also be employed to advantage.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A subarray control circuit, comprising:
   a wordline driver configured to generate a wordline activation signal;
   a write/read control signal generator configured to generate a write/read enable signal; and
   a timing generator configured to generate a wordline timing signal input to the wordline driver and a write/read timing signal input to the write/read control signal generator, the wordline activation signal based on the wordline timing signal and the write/read enable signal based on the write/read timing signal.

2. The subarray control circuit as recited in claim 1, wherein the wordline driver comprises a latch coupled to a logic circuit.

3. The subarray control circuit as recited in claim 2, wherein the logic circuit is configured to receive the wordline timing signal and generate the wordline activation signal based on the wordline timing signal.

4. The subarray control circuit as recited in claim 1, wherein the write/read control signal generator is a sense amplifier enable generator comprising a latch coupled to a logic circuit, the write/read enable signal is a sense amplifier enable signal, and the write/read timing signal is a sense amplifier timing signal.

5. The subarray control circuit as recited in claim 4, wherein the logic circuit is configured to receive the sense amplifier timing signal and generate the sense amplifier enable signal based on the sense amplifier timing signal.

6. The subarray control circuit as recited in claim 1, further comprising a global clock distribution circuit configured to distribute a global clock signal to the timing generator.

7. The subarray control circuit as recited in claim 6, wherein the wordline timing signal and write/read timing signal are based on the global clock signal.

8. A memory module, comprising:
   a subarray of cells configured to be activated or deactivated using a wordline activation signal; and
   a subarray control circuit coupled to the subarray of cells, comprising:
      a wordline driver configured to generate the wordline activation signal;
      a write/read control signal generator configured to generate a write/read enable signal; and
      a timing generator configured to generate a wordline timing signal input to the wordline driver and a write/read timing signal input to the write/read control signal generator, the wordline activation signal based on the wordline timing signal and the write/read enable signal based on the write/read timing signal.

9. The memory module as recited in claim 8, wherein the wordline driver comprises a latch coupled to a logic circuit.

10. The memory module as recited in claim 9, wherein the logic circuit is configured to receive the wordline timing signal and generate the wordline activation signal based on the wordline timing signal.

11. The memory module as recited in claim 8, wherein the write/read control signal generator is a sense amplifier enable generator comprising a latch coupled to a logic circuit, the write/read enable signal is a sense amplifier enable signal, and the write/read timing signal is a sense amplifier timing signal.

12. The memory module as recited in claim 11, wherein the logic circuit is configured to receive the sense amplifier timing signal and generate the sense amplifier enable signal based on the sense amplifier timing signal.

13. The memory module as recited in claim 8, further comprising a global clock distribution circuit configured to distribute a global clock signal to the timing generator, the wordline timing signal and write/read timing signal based on the global clock signal.

* * * * *